(12) United States Patent
Jinta et al.

(10) Patent No.: US 9,082,733 B2
(45) Date of Patent: Jul. 14, 2015

(54) DISPLAY UNIT AND ELECTRONIC APPARATUS

(71) Applicant: Sony Corporation, Tokyo (JP)

(72) Inventors: Seiichiro Jinta, Aichi (JP); Makoto Noda, Kanagawa (JP); Gaku Izumi, Tokyo (JP); Kenichi Izumi, Kanagawa (JP); Manabu Kodate, Kanagawa (JP); Takahiro Seki, Tokyo (JP); Michitoshi Tsuchiya, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 14/529,656

(22) Filed: Oct. 31, 2014

(65) Prior Publication Data

US 2015/0053963 A1 Feb. 26, 2015

Related U.S. Application Data

(63) Continuation of application No. 13/935,047, filed on Jul. 3, 2013, now Pat. No. 8,907,331.

(30) Foreign Application Priority Data

Jul. 31, 2012 (JP) ................................. 2012-170488

(51) Int. Cl.
 *H01L 35/24* (2006.01)
 *H01L 51/00* (2006.01)
 *H01L 27/32* (2006.01)
 *H01L 51/50* (2006.01)
 *H01L 51/52* (2006.01)

(52) U.S. Cl.
 CPC ........ *H01L 27/3246* (2013.01); *H01L 51/5012* (2013.01); *H01L 51/5218* (2013.01); *H01L 51/5228* (2013.01); *H01L 51/5234* (2013.01); *H01L 51/5246* (2013.01); *H01L 51/5253* (2013.01); *H01L 2251/5315* (2013.01)

(58) Field of Classification Search
 CPC ..... H01L 35/24; H01L 51/00; H01L 51/0504; H01L 51/0036; H01L 51/0541; H01L 51/5012
 USPC ................ 257/40, 93, E21.535; 438/22
 See application file for complete search history.

(56) References Cited

U.S. PATENT DOCUMENTS

| | | | |
|---|---|---|---|
| 7,776,641 B2* | 8/2010 | Rhee et al. | 438/70 |
| 7,842,944 B2* | 11/2010 | Choi et al. | 257/40 |
| 8,541,779 B1 | 9/2013 | Chen et al. | |
| 8,817,009 B2* | 8/2014 | Hayakawa et al. | 345/212 |
| 2005/0116620 A1* | 6/2005 | Kobayashi | 313/503 |
| 2005/0194894 A1 | 9/2005 | Sato | |

(Continued)

FOREIGN PATENT DOCUMENTS

| | | |
|---|---|---|
| JP | 2010-244808 A1 | 10/2010 |
| WO | WO-01/39554 A1 | 5/2001 |

*Primary Examiner* — Phuc Dang
(74) *Attorney, Agent, or Firm* — Fishman Stewart Yamaguchi PLLC

(57) ABSTRACT

A display unit comprising an organic layer between a light-emitting section portion of a first electrode layer and a light-emitting section portion of a second electrode layer. Light is emissible from within the organic layer. An aperture-defining insulating film is between a contact section of the first electrode layer and a gap section portion of the second electrode layer. The thickness of the gap section portion of the second electrode layer is greater than the thickness of the light-emitting section portion of the second electrode layer.

25 Claims, 19 Drawing Sheets

(56) References Cited

U.S. PATENT DOCUMENTS

| | | | |
|---|---|---|---|
| 2007/0131926 A1* | 6/2007 | Lee et al. | 257/40 |
| 2010/0084969 A1 | 4/2010 | Choi et al. | |
| 2010/0136722 A1* | 6/2010 | Kim et al. | 438/23 |
| 2010/0300517 A1 | 12/2010 | Shinohara | |
| 2013/0009134 A1* | 1/2013 | Shibata et al. | 257/40 |

* cited by examiner

DISPLAY UNIT AND ELECTRONIC APPARATUS

CROSS REFERENCES TO RELATED APPLICATIONS

This is a Continuation Application of U.S. patent application Ser. No. 13/953,047, filed on Jul. 3, 2013, now U.S. Pat. No. 8,907,331, which claims priority from Japanese Patent Application No.: 2012-170488 filed with the Japanese Patent Office on Jul. 31, 2012, the entire contents of which being incorporated herein by reference.

BACKGROUND

The present disclosure relates to a display unit having a self-emitting type light-emitting element including an organic layer, and an electronic apparatus that includes such a display unit.

In recent years, for a display unit as an alternative to a liquid crystal display, an organic EL display unit has been put into practical use that utilizes a self-emitting type organic EL (Electro Luminescence) element including an organic layer. The organic EL display unit has a wider angle of viewing field as an advantage of a self-emitting type in comparison with a liquid crystal display, and the like, as well as satisfactory response to high-resolution high-speed video signals.

In the past, for an organic EL element, an attempt on improvement of a display performance has been made in such a manner that a resonator structure is adopted, and light which is generated on a light-emitting layer is controlled by enhancing the color purity of luminescent colors or by increasing the luminous efficiency (for example, see International Publication No. WO 01/39554). For example, in a top emission method (top surface emission method) that takes light out of a surface on the side opposite to a substrate (top surface), an anode electrode, an organic layer, and a cathode electrode are laminated in this order via a driving transistor on the substrate, and then multiple reflection of light from the organic layer is carried out between the anode electrode and the cathode electrode.

In an organic EL display unit employing such a top emission method, to assure a high aperture ratio, a cathode electrode located at a sealing panel side is served as an integrated electrode layer that is provided in common on each organic EL element. Further, the cathode electrode is composed of an optically transparent conductive material such as ITO (Indium Tin Oxide) to take light out of a top surface. However, such an optically transparent conductive material exhibits a resistivity greater by approximately two to three orders of magnitude as compared with a typical metallic material, and the like. As a result, it is likely that a voltage that is applied to the cathode electrode may become uneven in plane, and thus a disadvantage has been found that the emission luminance could vary among each of organic EL elements depending on in-plane positions, which makes it difficult to achieve a satisfactory display quality.

Consequently, to resolve such a disadvantage, an organic EL display unit has been proposed that forms an auxiliary wiring to be connected with a cathode electrode on the same layer on which, for example, an anode electrode located at a driving panel side is formed, thereby suppressing voltage drop of the cathode electrode in an in-plane direction (for example, see Japanese Unexamined Patent Application Publication No. 2010-244808). In such an organic EL display unit, for example, the auxiliary wiring is connected with the cathode electrode at an area out of a display region of each organic EL element. In such a manner, above-described variation in the emission luminance among each of the organic EL elements depending on in-plane positions is alleviated to some extent by laying out the auxiliary wiring in a mesh form along the cathode electrode extending in an in-plane direction and by connecting the auxiliary wiring with the cathode electrode.

SUMMARY

In the case of Japanese Unexamined Patent Application Publication No. 2010-244808, an auxiliary wiring to be connected with a cathode electrode is provided on the same layer on which an anode electrode is formed, and thus it is necessary to assure a sufficient space for laying out the auxiliary wiring. This poses an impediment to improvement of the aperture ratio on a display section. Similarly, even when the auxiliary wiring is provided on the same layer on which an electrode for a driving element that performs a display driving for the organic EL element is formed, the same disadvantage takes place as well.

As a method to resolve such a disadvantage, a method may be contemplated to provide the auxiliary wiring to be connected with a cathode electrode on any layer different from a layer on which an anode electrode or an electrode for a driving element is formed, although this is not practical because it leads to complicated structure and bothersome manufacturing.

It is desirable to provide a display unit capable of exhibiting more excellent image display performance in spite of a simple configuration, and an electronic apparatus that includes such a display unit.

The display unit comprises an organic layer between a light-emitting section portion of a first electrode layer and a light-emitting section portion of a second electrode layer. Light is emissible from within the organic layer. An aperture-defining insulating film is between a contact section of the first electrode layer and a gap section portion of the second electrode layer. The thickness of the gap section portion of the second electrode layer is greater than the thickness of the light-emitting section portion of the second electrode layer.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Embodiments

Hereinafter, some embodiments of the present disclosure are described in details with reference to the drawings.

Figure 1:
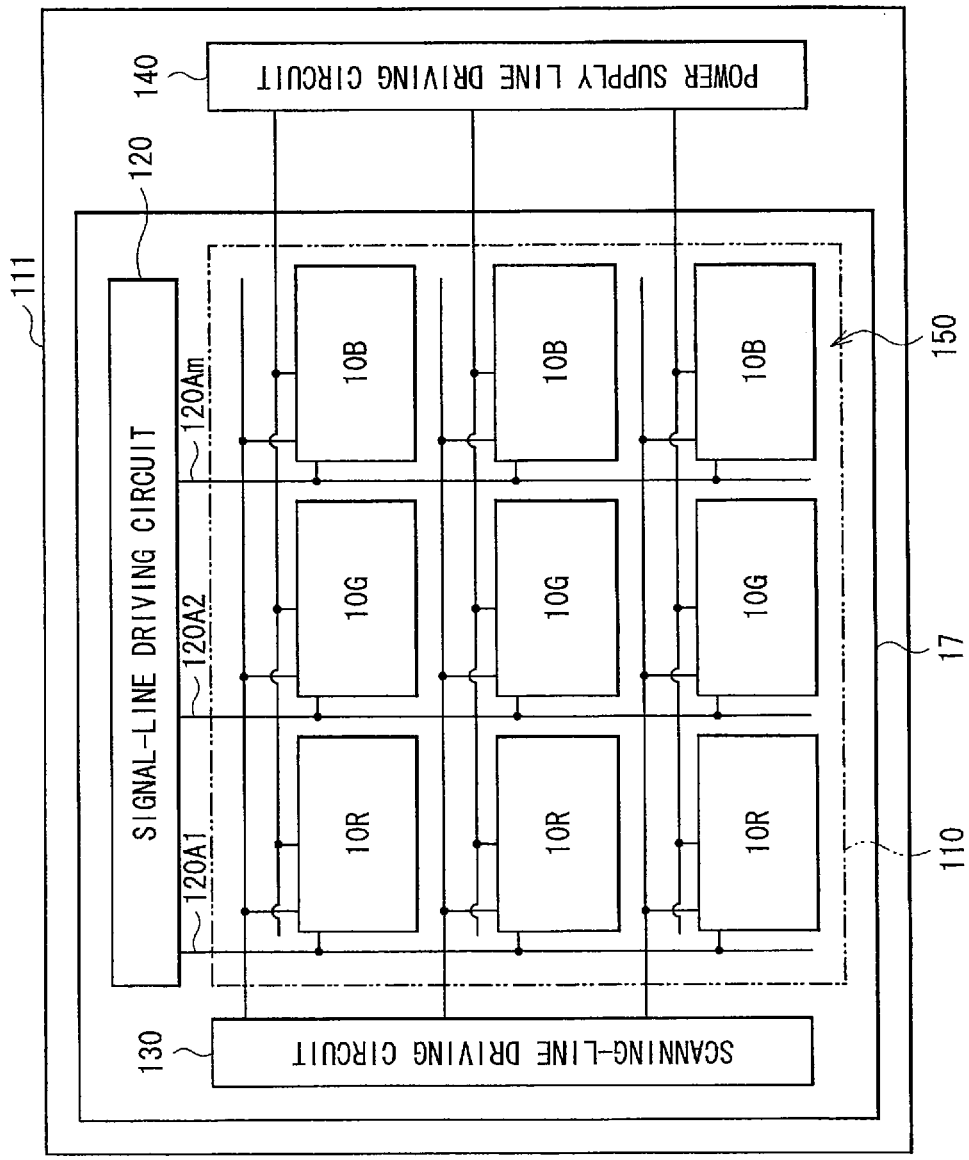
FIG. 1 is a schematic block diagram showing a configuration of a display unit according to one embodiment of the present disclosure.

FIG. 1 shows a configuration of a display unit using organic light-emitting elements according to one embodiment of the present disclosure. The display unit may be utilized as an ultralow-profile organic light-emitting color display unit, and the like. This display unit is provided with a display region 110 that is formed on a substrate 111. At the periphery of the display region 110 on the substrate 111, for example, there may be formed a signal-line driving circuit 120, a scanning-line driving circuit 130, and a power supply line driving circuit 140 which are drivers for image display. Further, at the periphery of the display region 110, there is provided an auxiliary wiring 17 (to be hereinafter described) that is looped to surround the display region 110. The auxiliary wiring 17 is a metallic layer that is conductive with a second electrode layer 16 to be described later.

On the display region 110, there are formed a plurality of organic light-emitting elements 10 (10R, 10G, and 10B) that are arranged two-dimensionally in a matrix pattern, and a pixel driving circuit 150 for driving the organic light-emitting elements 10. In the pixel driving circuit 150, a plurality of signal lines 120A (120A1, 120A2, . . . , 120Am, . . . ) are arrayed in a column direction, while a plurality of scanning lines 130A (130A1, . . . , 130An, . . . ) and a plurality of power supply lines 140A (140A1, . . . , 140An, . . . ) are arrayed in a row direction. Any one of the organic light-emitting elements 10R, 10G, and 10B is provided correspondingly at each point of intersection between each of the signal lines 120A and each of the scanning lines 130A. Each of the signal lines 120A is connected with the signal-line driving circuit 120, and each of the scanning lines 130A is connected with the scanning-line driving circuit 130, while each of the power supply lines 140A is connected with the power supply line driving circuit 140.

The signal-line driving circuit 120 provides a signal voltage of an image signal in accordance with luminance information to be delivered from a signal source (not shown in the figure) to the organic light-emitting elements 10R, 10G, and 10B that are selected via the signal lines 120A.

The scanning-line driving circuit 130 is composed of, for example, a shift register that shifts (transfers) start pulses sequentially in synchronization with clock pulses to be applied. In writing an image signal into each of the organic light-emitting elements 10R, 10G, and 10B, the scanning-line driving circuit 130 scans them for each row to provide a scan signal sequentially to each of the scanning lines 130A.

The power supply line driving circuit 140 is composed of, for example, a shift register that shifts (transfers) start pulses sequentially in synchronization with clock pulses to be applied. In synchronization with a scan for each row that is performed by the scanning-line driving circuit 130, the power supply line driving circuit 140 provides either a first potential or a second potential that is different from one another to each of the power supply lines 140A as appropriate. This selects a conducting state or a non-conducting state of a driving transistor Tr1 to be hereinafter described.

Figure 2:
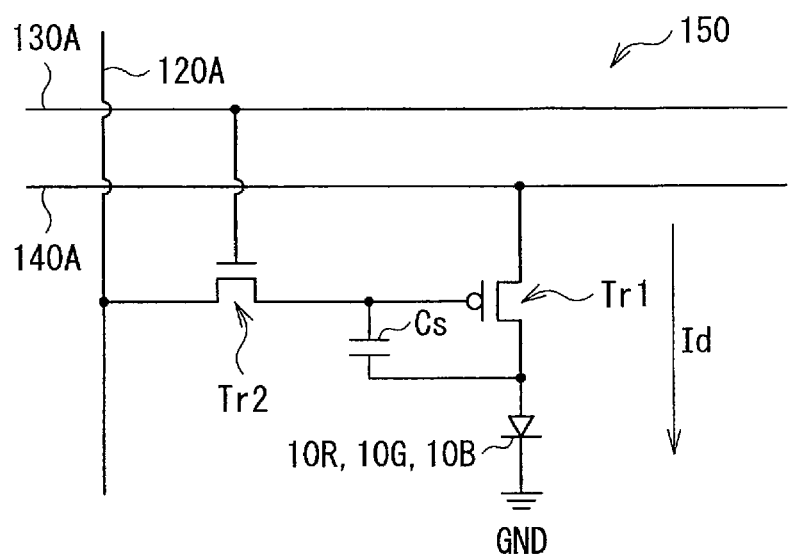
FIG. 2 is a circuit diagram showing an example of a pixel driving circuit illustrated in FIG. 1.

The pixel driving circuit 150 is provided in a layer level (i.e., pixel driving circuit formation layer 112 to be hereinafter described) between the substrate 111 and the organic light-emitting elements 10. FIG. 2 shows a configuration example of the pixel driving circuit 150. As shown in FIG. 2, the pixel driving circuit 150 is an active-type driving circuit having the driving transistor Tr1 and a writing transistor Tr2, a capacitor (holding capacitor) Cs that is provided between these transistors, and the organic light-emitting elements 10. The organic light-emitting elements 10 are connected in series with the driving transistor Tr1 between the power supply line 140A and a common power supply line (GND). Each of the driving transistor Tr1 and the writing transistor Tr2 is composed of a typical TFT (Thin-Film Transistor), and a configuration thereof is not limited to a specific one, and may be an inversely staggered structure (so-called bottom-gate type) or a staggered structure (so-called top-gate type).

On the writing transistor Tr2, for example, a drain electrode is connected with the signal line 120A, and an image signal from the signal-line driving circuit 120 is provided. Further, a gate electrode on the writing transistor Tr2 is connected with the scanning line 130A, and a scan signal from the scanning-line driving circuit 130 is provided. Additionally, a source electrode on the writing transistor Tr2 is connected with a gate electrode on the driving transistor Tr1.

On the driving transistor Tr1, for example, a drain electrode is connected with the power supply line 140A, and the voltage thereof is set to the first potential or the second potential that is provided by the power supply line driving circuit 140. A source electrode on the driving transistor Tr1 is connected with the organic light-emitting elements 10. The driving transistor Tr1 is a driving element for controlling a voltage to be applied across a first electrode layer 13 (to be described later) and the second electrode layer 16.

The holding capacitor Cs is formed between the gate electrode of the driving transistor Tr1 (source electrode of the writing transistor Tr2) and the source electrode of the driving transistor Tr1.

Figure 3:
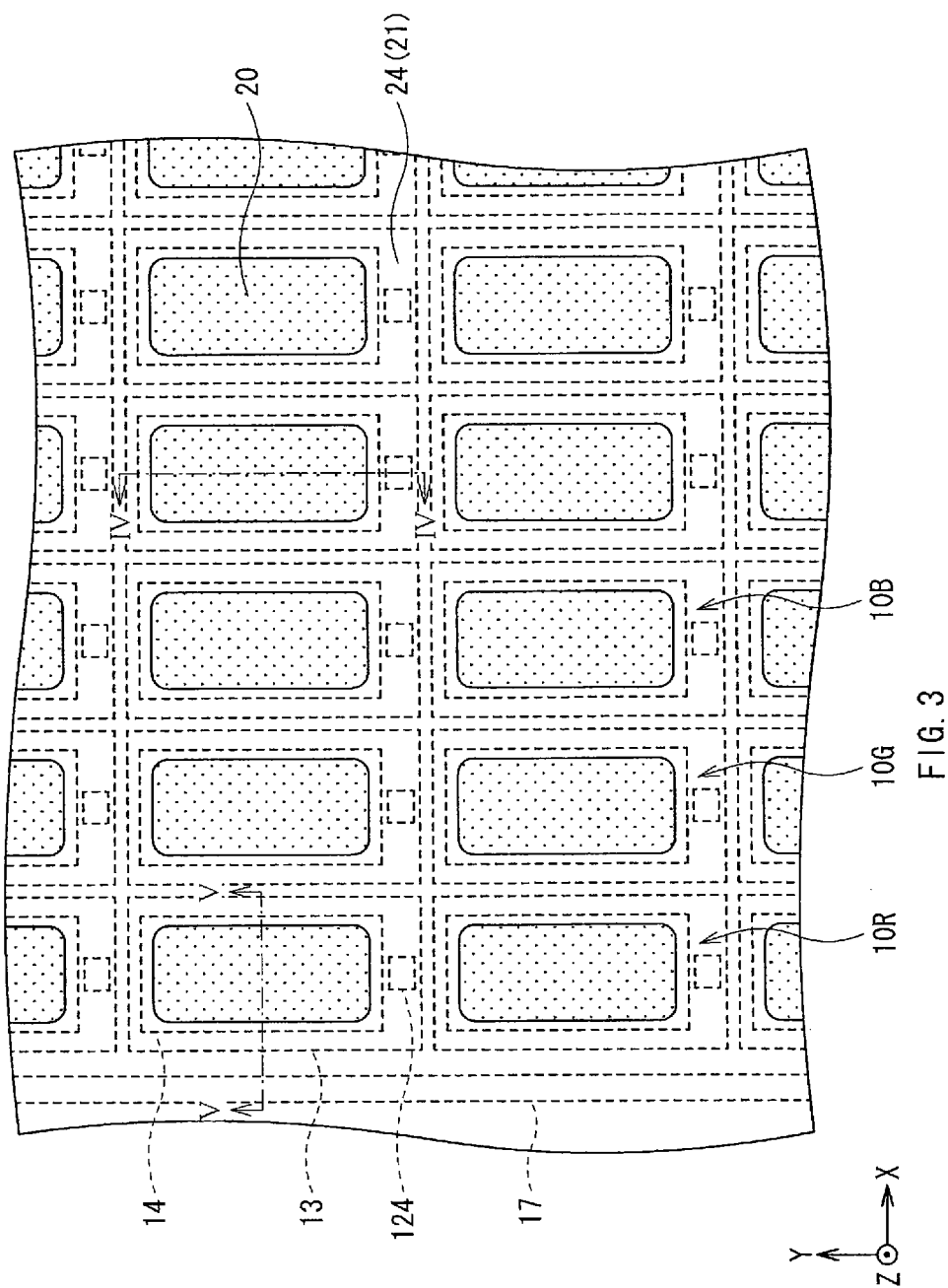
FIG. 3 is a top view showing a configuration of a display region illustrated in FIG. 1.

FIG. 3 shows a configuration example of the display region 110 extending over X-Y plane. FIG. 3 illustrates a planar configuration viewed from the top side for the display region 110 in a state where the second electrode layer 16, a protective film 18 and a sealing substrate 19 (both are to be described later) are removed. On the display region 110, the plurality of the organic light-emitting elements 10 are lined up in X direction and Y direction to be arranged in a matrix pattern as a whole. More specifically, each of the organic light-emitting elements 10R, 10G, and 10B, which is separated from each other by an aperture-defining insulating film 24 and includes a light-emitting section 20 whose contour is defined, is disposed one by one. The organic light-emitting element 10R emits red-color light, and the organic light-emitting element 10G emits green-color light, while the organic light-emitting element 10B emits blue-color light. Hereupon, the organic light-emitting elements 10 that emit the same color light are arranged on a line in Y direction, and such patterns are disposed repeatedly in X direction sequentially. Accordingly, a combination of the organic light-emitting elements 10R, 10G, and 10B that are adjacent to each other in X direction composes a single pixel.

In FIG. 3, a dashed rectangle surrounding the light-emitting section 20 represents a region in which an organic layer 14 is formed. Desirably, the organic layer 14 may be larger in size than the light-emitting section 20 on the organic light-emitting element 10 that the organic layer 14 itself composes, and the organic layer 14 may not be overlapped with the light-emitting section 20 on other adjacent organic light-emitting element 10. It does not matter that the organic layers 14 that compose the adjacent organic light-emitting elements 10 overlap with one another in a gap section 21 that is a section other than the light-emitting section 20. Further, a dashed rectangle surrounding the region in which the organic layer 14 is formed represents a region in which the first electrode layer 13 is formed. At a part of the first electrode layer 13, for example, there may be provided a contact section 124 that is served for conduction with the source electrode on the driving transistor Tr1. It is to be noted that the number of the organic light-emitting elements 10 that are arranged in X direction and Y direction is set up optionally, and is not limited to the number indicated in FIG. 3. Also, a single pixel may be composed of four or more organic light-emitting elements, or an organic light-emitting element that emits white-color light may be provided additionally.

Figure 4:
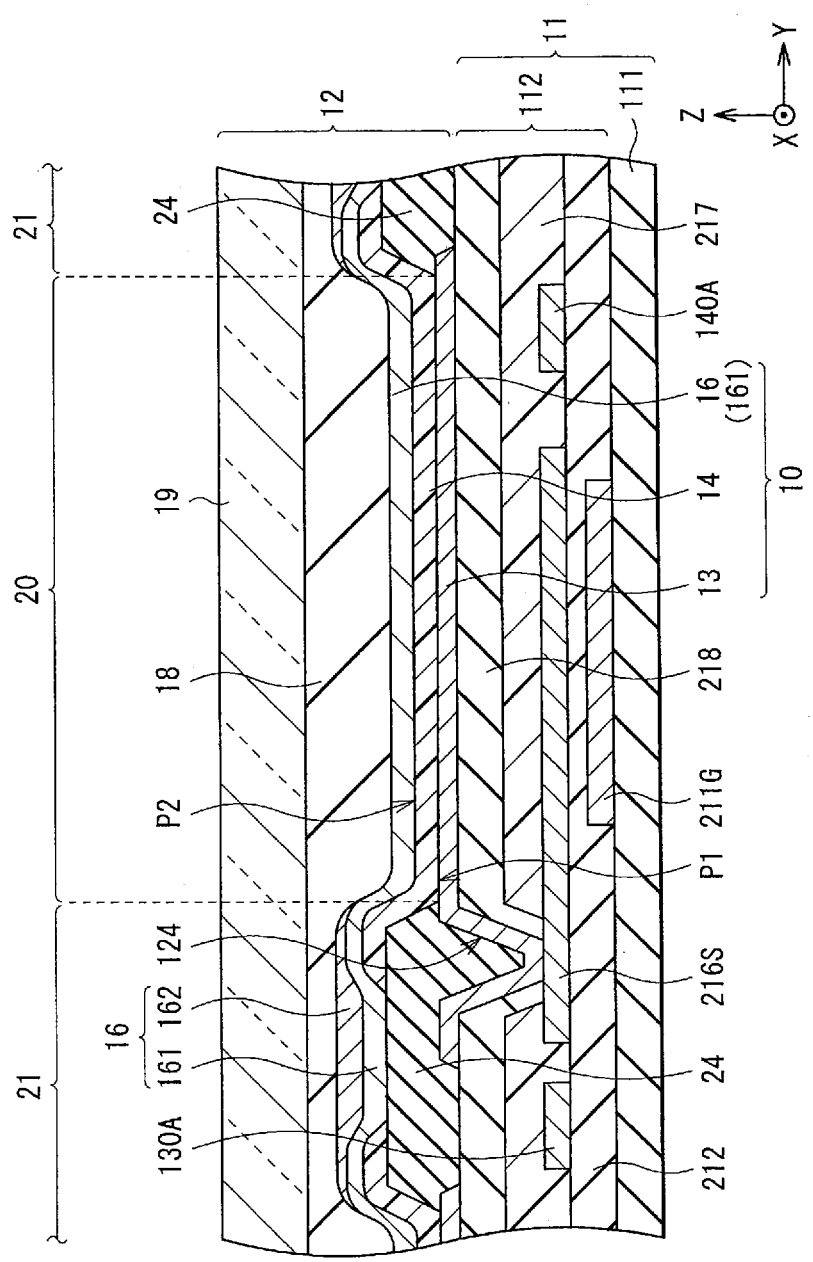
FIG. 4 is a cross-sectional diagram showing a configuration of the display region illustrated in FIG. 1.

FIG. 4 shows a simplified structure of X-Z cross-sectional surface along IV-IV line illustrated in FIG. 3 in the display region 110. As shown in FIG. 4, in the display region 110, a light-emitting element formation layer 12 including the organic light-emitting elements 10 is formed on a base substrate 11 that is composed of the pixel driving circuit formation layer 112 that is provided on the substrate 111. On the top of the organic light-emitting elements 10, the protective film 18 and the sealing substrate 19 are provided in this order. Each of the organic light-emitting elements 10 is composed of the first electrode layer 13 as an anode electrode, the organic layer 14 including a luminescent layer 14C (to be hereinafter described), and the second electrode layer 16 as a cathode electrode that are laminated in this order from the substrate 111 side. The first electrode layers 13 of the respective organic light-emitting elements 10 that are adjacent to each other are separated from one another by the aperture-defining insulating film 24, and the organic layers 14 of the respective organic light-emitting elements 10 that are adjacent to each other are separated from one another by the aperture-defining insulating film 24. On the other hand, the second electrode layer 16 is provided in common for all the organic light-emitting elements 10. It is to be noted that, in FIG. 4, a detailed configuration of the driving transistor Tr1, the writing transistor Tr2, and the like on the pixel driving circuit formation layer 112 is omitted.

The aperture-defining insulating film 24 is provided to fill a gap between the first electrode layer 13 and the organic layer 14 on the adjacent organic light-emitting elements 10, that is, the gap section 21 that is a gap between the light-emitting sections 20. The aperture-defining insulating film 24, which may be composed of, for example, an organic material such as polyimide, assures the insulation performance between the first electrode layer 13 and the second electrode layer 16, while accurately defining the light-emitting sections 20 on the organic light-emitting elements 10.

The protective film 18 that covers the organic light-emitting elements 10 is composed of an insulating material such as silicon nitride (SiNx). Further, the sealing substrate 19 that is provided on the protective film 18, which seals the organic light-emitting elements 10 together with the protective film 18, an adhesive layer (not shown in the figure) and the like, is composed of a material such as transparent glass that transmits light arising on the luminescent layer 14C therethrough.

Figure 5:
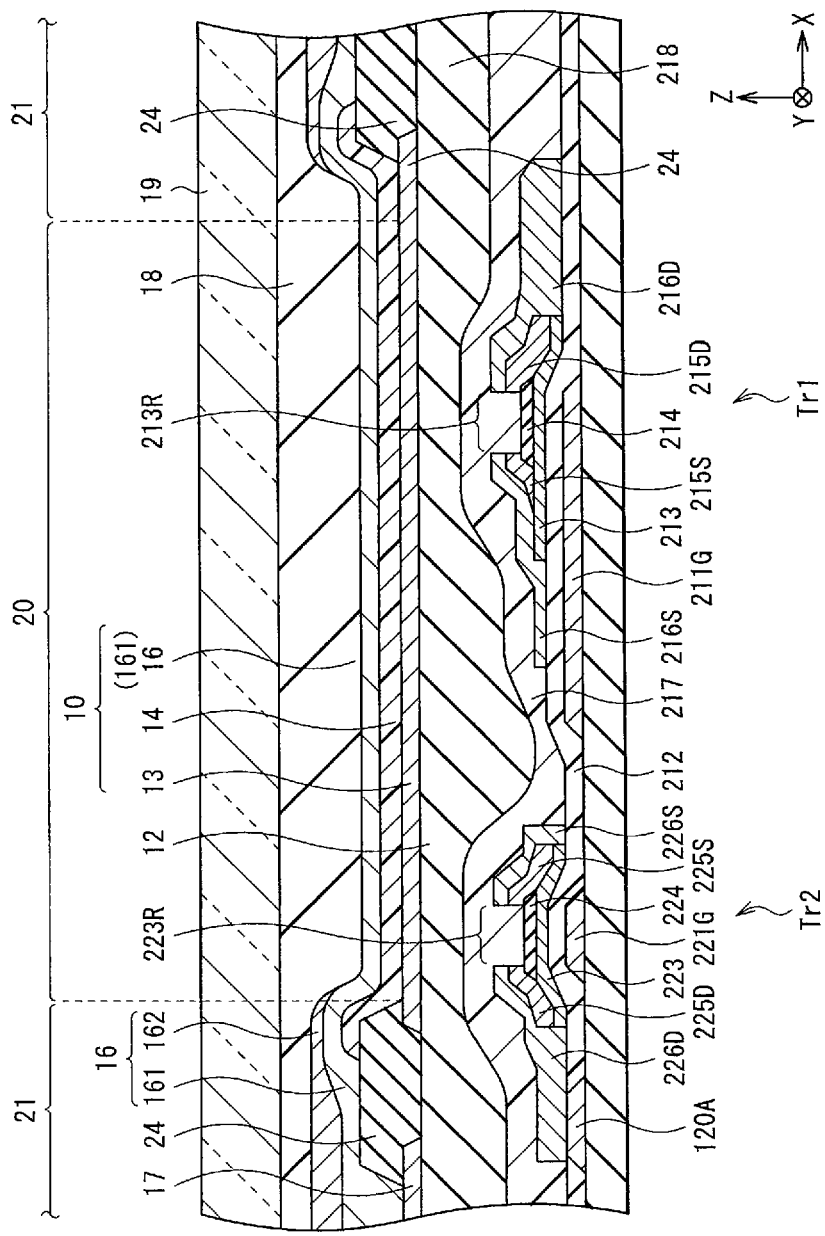
FIG. 5 is another cross-sectional diagram showing a configuration of the display region illustrated in FIG. 1.
Figure 6:
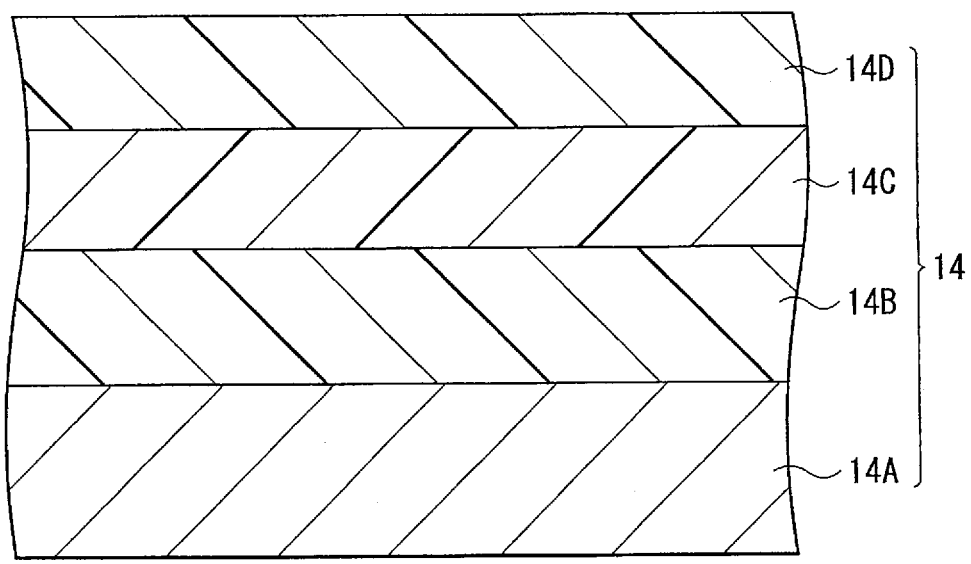
FIG. 6 is an enlarged cross-sectional diagram showing an organic layer illustrated in FIG. 4 and FIG. 5.

Next, with reference to FIG. 5 and FIG. 6 in addition to FIG. 4, the descriptions are provided on detailed configurations of the base substrate 11 and the organic light-emitting elements 10. It is to be noted that each of the organic light-emitting elements 10R, 10G, and 10B has a configuration in common with the exception that a configuration of the organic layer 14 is different in part, and thus they are collectively described hereinafter.

FIG. 5 is a cross-sectional diagram taken along V-V line in the display region 110 illustrated in FIG. 3. Further, FIG. 6 is an enlarged cross-sectional diagram showing a part of the organic layer 14 illustrated in FIG. 4 and FIG. 5.

The base substrate 11 is a component part where the pixel driving circuit formation layer 112 including the pixel driving circuit 150 is provided on the substrate 111 that is composed of a material, such as glass, silicon (Si) wafer, or resin. On the top face of the substrate 111, as first-level metallic layers, there are provided a metallic layer 211G that is a gate electrode of the driving transistor Tr1 and a metallic layer 221G that is a gate electrode of the writing transistor Tr2 (FIG. 5), as well as the signal lines 120A (FIG. 5). These metallic layers 211G and 221G, as well as the signal lines 120A are covered with a gate insulating film 212 that is composed of a material, such as silicon nitride and silicon oxide.

At a region corresponding to the metallic layers 211G and 221G on the gate insulating film 212, there are provided channel layers 213 and 223 each of which is composed of a semiconductor thin film such as amorphous silicon. On the channel layers 213 and 223, there are provided insulating channel protective films 214 and 224 respectively to occupy channel regions 213R and 223R that are central regions for the channel layers 213 and 223, and there are provided drain electrodes 215D and 225D as well as source electrodes 215S and 225S, each of which is composed of an n-type semiconductor thin film such as n-type amorphous silicon, at a region on both sides of the insulating channel protective films 214 and 224. The drain electrodes 215D and 225D as well as the source electrodes 215S and 225S are separated from each other by the channel protective films 214 and 224 respectively, and end faces thereof are separated from each other with the channel regions 213R and 223R interposed between. Further, as second-level metallic layers, metallic layers 216D and 226D as drain wiring as well as metallic layers 216S and 226S as source wiring are provided to cover each of the drain electrodes 215D and 225D as well as the source electrodes 215S and 225S, respectively. Each of the metallic layers 216D and 226D as well as the metallic layers 216S and 226S may have a structure of laminating, for example, a titanium (Ti) layer, an aluminum (Al) layer, and a titanium layer in this order. As the second-level metallic layers, in addition to the metallic layers 216D and 226D as well as the metallic layers 216S and 226S as described above, there are provided the scanning lines 130A and the power supply lines 140A (FIG. 4). It is to be noted that the description is here provided on the driving transistor Tr1 and the writing transistor Tr2 that adopt an inversely staggered structure (so-called bottom-gate type), although such transistors adopting a staggered structure (so-called top-gate type) may be permitted alternatively. Further, the signal lines 120A may be provided on the second-level layer at any region other than a point of intersection between each of the scanning lines 130A and the power supply lines 140A.

The pixel driving circuit 150 is covered over a whole area with a protective film (passivation film) 217 that is composed of a material such as silicon nitride, and an insulating planarizing film 218 is further provided on the protective film 217. Preferably, the planarizing film 218 may have a top surface with extremely-high planarity. Further, at a part of a region of the planarizing film 218 and the protective film 217, there is provided the microscopic contact section 124 (FIG. 4). Because especially the planarizing film 218 is larger than the protective film 217 in thickness, preferably, the planarizing film 218 may be composed of a material with excellent pattern accuracy, such as an organic material including polyimide and the like. The contact section 124, which is filled up with the first electrode layer 13, is conductive with the metallic layer 216S composing a source electrode of the driving transistor Tr1.

The first electrode layer 13 that is formed on the planarizing film 218 also has a functionality as a reflective layer, and thus, preferably, the first electrode layer 13 may be composed of a material with the highest possible reflectance to improve the luminous efficiency. Therefore, the first electrode layer 13 is composed of a high-reflectance material, such as aluminum (Al) and aluminum neodymium alloy (AlNd).

The organic layer 14 is formed without any void over a whole area of the light-emitting sections 20 each of which is defined by the aperture-defining insulating film 24. As shown in an example in FIG. 6, the organic layer 14 may have a structure in which a hole injection layer 14A, a hole transportation layer 14B, the luminescent layer 14C, and an electron transportation layer 14D are laminated in this order from the first electrode layer 13 side. It is to be noted that any layers other than the luminescent layer 14C may be provided as appropriate.

The hole injection layer 14A is a buffer layer to improve the hole injection efficiency, as well as to prevent any leakage. The hole transportation layer 14B increases the hole transportation efficiency to the luminescent layer 14C. The luminescent layer 14C generates light in such a manner that recombination of electron and hole occurs by applying electric field. The electron transportation layer 14D improves the electron transportation efficiency to the luminescent layer 14C. It is to be noted that an electron injection layer (not shown in the figure) that is composed of a material, such as LiF and $Li_2O$ may be provided between the electron transportation layer 14D and the second electrode layer 16.

Further, the organic layer 14 is different in configuration depending on luminescent colors of the organic light-emitting elements 10R, 10G, and 10B. The hole injection layer 14A on the organic light-emitting element 10R, which may be at least approximately 5 nm but no more than approximately 300 nm in thickness, may be composed of 4,4',4"-tris(3-methylphenyl phenylamino)triphenylamine (m-MTDATA) or 4,4',4"-tris(2-naphthyl phenylamino)triphenylamine (2-TNATA). The hole transportation layer 14B on the organic light-emitting element 10R, which may be at least approximately 5 nm but no more than approximately 300 nm in thickness, may be composed of bis[(N-naphthyl)-N-phenyl]benzine (α-NPD). The luminescent layer 14C on the organic light-emitting element 10R, which may be at least approximately 10 nm but no more than approximately 100 nm in thickness, may be composed of a material mixing 8-quinolinol aluminum complex (Alq3) with 2,6-bis[4-[N-(4-methoxyphenyl)-N-phenyl]aminostyryl]naphthalene-1,5-dicarbonitrile (BSN-BCN) at approximately 40% ratio in volume. The electron transportation layer 14D on the organic light-emitting element 10R, which may be at least approximately 5 nm but no more than approximately 300 nm in thickness, may be composed of Alq3.

The hole injection layer 14A on the organic light-emitting element 10G, which may be at least approximately 5 nm but no more than approximately 300 nm in thickness, may be composed of m-MTDATA or 2-TNATA. The hole transportation layer 14B on the organic light-emitting element 10G, which may be at least approximately 5 nm but no more than approximately 300 nm in thickness, may be composed of α-NPD. The luminescent layer 14C on the organic light-emitting element 10G, which may be at least approximately 10 nm but no more than approximately 100 nm in thickness, may be composed of a material mixing Alq3 with Coumarin 6 at approximately 3% ratio in volume. The electron transportation layer 14D on the organic light-emitting element 10G, which may be at least approximately 5 nm but no more than approximately 300 nm in thickness, may be composed of Alq3.

The hole injection layer 14A on the organic light-emitting element 10B, which may be at least approximately 5 nm but no more than approximately 300 nm in thickness, may be composed of m-MTDATA or 2-TNATA. The hole transportation layer 14B on the organic light-emitting element 10B, which may be at least approximately 5 nm but no more than approximately 300 nm in thickness, may be composed of α-NPD. The luminescent layer 14C on the organic light-emitting element 10B, which may be at least approximately 10 nm but no more than approximately 100 nm in thickness, may be composed of spiro 6ϕ. The electron transportation layer 14D on the organic light-emitting element 10B, which may be at least approximately 5 nm but no more than approximately 300 nm in thickness, may be composed of Alq3.

The second electrode layer 16 has a two-layer structure including a first conductive layer 161 and a second conductive layer 162. The first conductive layer 161 is provided in common with two or more or all of the organic light-emitting elements 10R, 10G, and 10B, being disposed in opposition to the first electrode layer 13 on each of the organic light-emitting elements 10R, 10G, and 10B. Further, the first conductive layer 161 is formed to cover not only the organic layer 14 but also the aperture-defining insulating film 24. On the other hand, the second conductive layer 162, which is not provided at the light-emitting section 20, is provided only at the gap section 21 in which the aperture-defining insulating film 24 is formed. Accordingly, the second electrode layer 16 has a thickness greater than that of the light-emitting section 20 at the gap section 21 in which the aperture-defining insulating film 24 is formed. It is to be noted that the second electrode layer 16 may have a thickness greater than that of the light-emitting section 20 in at least a part of the gap section 21. The gap section 21 where the second conductive layer 162 is provided on the second electrode layer 16 extends toward both of X direction and Y direction along an arrangement of the organic light-emitting elements 10.

The first conductive layer 161 is a transparent electrode that is composed of a conductive material having adequate translucency to light arising on the luminescent layer. Preferably, a constituent material thereof may be, for example, a compound containing ITO or indium, zinc (Zn), and oxygen.

A constituent material for the second conductive layer 162 may be the same as, or different from a constituent material for the first conductive layer 161. However, preferably, a constituent material for the second conductive layer 162 may have lower volume resistivity than that of a constituent material for the first conductive layer 161. This is because it is possible to further suppress voltage drop in the second electrode layer 16. Hereupon, the second conductive layer 162 does not have to be transparent since it is formed only at the gap section 21 other than the light-emitting section 20 on the second electrode layer 16. Accordingly, it is possible to apply an opaque, but highly conductive metallic material, such as an elementary substance of Al, Cu, or Ag. It is to be noted that a whole gap area that is provided at the gap section 21 on the second electrode layer 16 may be formed of an opaque and highly conductive material. In other words, the second electrode layer 16 may be composed of different materials for the light-emitting section 20 and the gap section 21.

As previously described, the auxiliary wiring 17 is provided in a loop to surround the display region 110 on which the plurality of the organic light-emitting elements 10 are arranged. As with, for example, the first electrode layer 13, the auxiliary wiring 17 is formed on the top surface of the planarizing film 218 (FIG. 5), and has a functionality to compensate for voltage drop in the second electrode layer 16 as a main electrode. A part of the auxiliary wiring 17 comes in contact with the second electrode layer 16 at a peripheral region of the display region 110, and remains in a state of being electrically connected with the second electrode layer 16 (see FIG. 5). Preferably, a constituent material for the auxiliary wiring 17 may be a highly conductive metallic material, such as aluminum (Al), copper (Cu), silver (Ag), and titanium (Ti) in the case of a single-layer structure. It is to be noted that the auxiliary wiring 17 would not be necessary if presence of the second conductive layer 162 could fully suppress voltage drop in the second electrode layer 16.

It is possible to manufacture this display unit, for example, in the following manner. Hereinafter, with reference to FIG. 4 to FIG. 6, and the like, the descriptions are provided on a method for manufacturing the display unit according to this embodiment of the present disclosure.

First, the pixel driving circuit 150 including the driving transistor Tr1 and the writing transistor Tr2 is formed on the substrate 111 that is composed of the above-described material. In concrete terms, first, a metallic film is formed on the substrate 111 using, for example, a sputtering technique. Subsequently, the metallic layers 211G and 221G, as well as a part of the signal lines 120A are formed on the substrate 111 by patterning the resultant metallic film utilizing, for example, a photolithographic technique, dry etching, or wet etching technique. Next, the whole area is covered with the gate insulating film 212. Further, a channel layer, a channel protective film, a drain electrode, a source electrode, the metallic layers 216D and 226D, as well as the metallic layers 216S and 226S are formed in predetermined shapes in order on the gate insulating film 212. Hereupon, in conjunction with formation of the metallic layers 216D and 226D, as well as the metallic layers 216S and 226S, a part of the signal lines 120A, the scanning lines 130A, and the power supply lines 140A are formed respectively as the second-level metallic layers. On this occasion, a connection section for connecting the metallic layer 221G with the scanning lines 130A, a connection section for connecting the metallic layer 226D with the signal lines 120A, and a connection section for connecting the metallic layer 226S with the metallic layer 211G are formed beforehand. Thereafter, the whole surface is covered with the protective film 217, thereby bringing the pixel driving circuit 150 to completion. At this time, an opening is formed at a predetermined position on the metallic layer 216S on the protective film 217 using a dry etching or other technique.

After formation of the pixel driving circuit 150, a photosensitive resin containing, for example, polyimide as a primary constituent is coated over a whole surface thereof utilizing a spin coating technique, and the like. Thereafter, the planarizing film 218 having the contact section 124 is formed by performing a photolithographic treatment for the photosensitive resin. More specifically, the contact section 124 in communication with an opening that is provided on the protective film 217 is formed by means of, for example, selective exposure and development using a mask having an opening at a predetermined position. Afterward, the planarizing film 218 may be calcinated if necessary. In such a manner, the pixel driving circuit formation layer 112 is obtained.

Further, the first electrode layer 13 and the auxiliary wiring 17 that are composed of the predetermined materials as described above are formed. In concrete terms, a metallic film that is composed of the above-described material is formed over a whole surface using, for example, a sputtering technique, and then a resist pattern in a predetermined shape (not shown in the figure) is formed using a predetermined mask on the resultant laminated film. Further, using this resist pattern as a mask, selective etching of the metallic film is carried out. On this occasion, the first electrode layer 13 is formed in a manner to cover the top surface of the planarizing film 218, as well as to fill up the contact section 124. Further, the auxiliary wiring 17 is formed in a manner to surround peripheral areas of all the first electrode layers 13 on the top surface of the planarizing film 218. Preferably, the auxiliary wiring 17 may be formed collectively together with the first electrode layer 13 using the same kind of material as the first electrode layer 13. This is because manufacturing is simplified.

Subsequently, the aperture-defining insulating film 24 is formed in a manner to fill up a gap between the adjacent first electrode layers 13, as well as to cover the auxiliary wiring 17. On this occasion, an opening is provided at a part of a portion covering the auxiliary wiring 17. This is because contact between the second electrode layer 16 to be formed later and the auxiliary wiring 17 is ensured. Next, the organic layer 14 is formed by sequentially laminating the hole injection layer 14A, the hole transportation layer 14B, the luminescent layer 14C, and the electron transportation layer 14D, which are composed of the predetermined materials with prescribed thicknesses as described above, using, for example, a vapor deposition technique in a manner to completely cover an exposed portion on the first electrode layer 13. Subsequently, the first conductive layer 161 is formed over the whole surface in a manner to cover the first electrode layer 13 in opposition to one another with the organic layer 14 interposed between, as well as to cover the auxiliary wiring 17 at a predetermined opening. Finally, the organic light-emitting element 10 is obtained in such a manner that the second conductive layer 162 is formed at a region corresponding to the aperture-defining insulating film 24 on the first conductive layer 161, thereby bringing the second electrode layer 16 to completion. Hereupon, it is possible to form the second conductive layer 162 in the following manner. First, for example, a portion extending toward a first direction (for example, X direction) is formed in such a manner that a sputtering is carried out by using a metal mask (not shown in the figure) in which a plurality of slits extending toward the first direction are arrayed toward a second direction (for example, Y direction). Afterward, a portion extending toward the second direction is formed in such a manner that a sputtering is carried out by using a metal mask (not shown in the figure) in which a plurality of slits extending toward the second direction are arrayed toward the first direction (or by rotating the above-described metal mask at an angle of approximately 90 degrees). In this way, the second conductive layer 162 is formed that has a grid-shaped planar pattern corresponding to the arrangement of the light-emitting sections 20 in X-Y plane.

Thereafter, the protective film 18 that is made of the above-described material is formed to cover the whole surface. Finally, an adhesive layer is formed on the protective film 18, and the sealing substrate 19 is attached with the adhesive layer interposed between. Such steps complete formation of the display unit.

In the display unit that is obtained in such a manner, a scan signal is provided from the scanning-line driving circuit 130 via a gate electrode (metallic layer 221G) of the writing transistor Tr2 to each of the pixels, and an image signal that is sent from the signal-line driving circuit 120 via the writing transistor Tr2 is held by the holding capacitor Cs. Meanwhile, in synchronization with scanning for each row that is performed by the scanning-line driving circuit 130, the power supply line driving circuit 140 provides the first potential higher than the second potential to each of the power supply lines 140A. This selects a conducting state of the driving transistor Tr1 to inject a driving current Id into each of the organic light-emitting elements 10R, 10G, and 10B, thereby recombining holes and electrons to generate light emission. Multiple reflection of this light is performed between the first electrode layer 13 and the second electrode layer 16, and the light is transmitted through the second electrode layer 16, the protective film 18, and the sealing substrate 19 to be taken out.

As described above, in this embodiment of the present disclosure, a resistance toward an in-plane direction on the second electrode layer 16 is made smaller at a gap area that is provided at the gap section 21 covering the aperture-defining insulating film 24 than a luminescent portion composing the light-emitting sections 20. This fully suppresses any voltage drop in the second electrode layer 16 without separately providing the auxiliary wiring at the gap section 21 that separates the organic light-emitting elements 10 from each other. Consequently, it is less likely that luminance deterioration or luminance irregularity will partially occur in the display region 110. Further, since the necessity for increasing a thickness of the second electrode layer 16 on the light-emitting section 20 is also eliminated, it is possible to maintain the overall emission luminance at the display region 110 without causing reduction in the transmittance on the second electrode layer 16. As a result, this allows to maintain an increased emission luminance, while improving the uniformity in distribution of the emission luminance thereof for achieving higher display performance.

Figure 7:
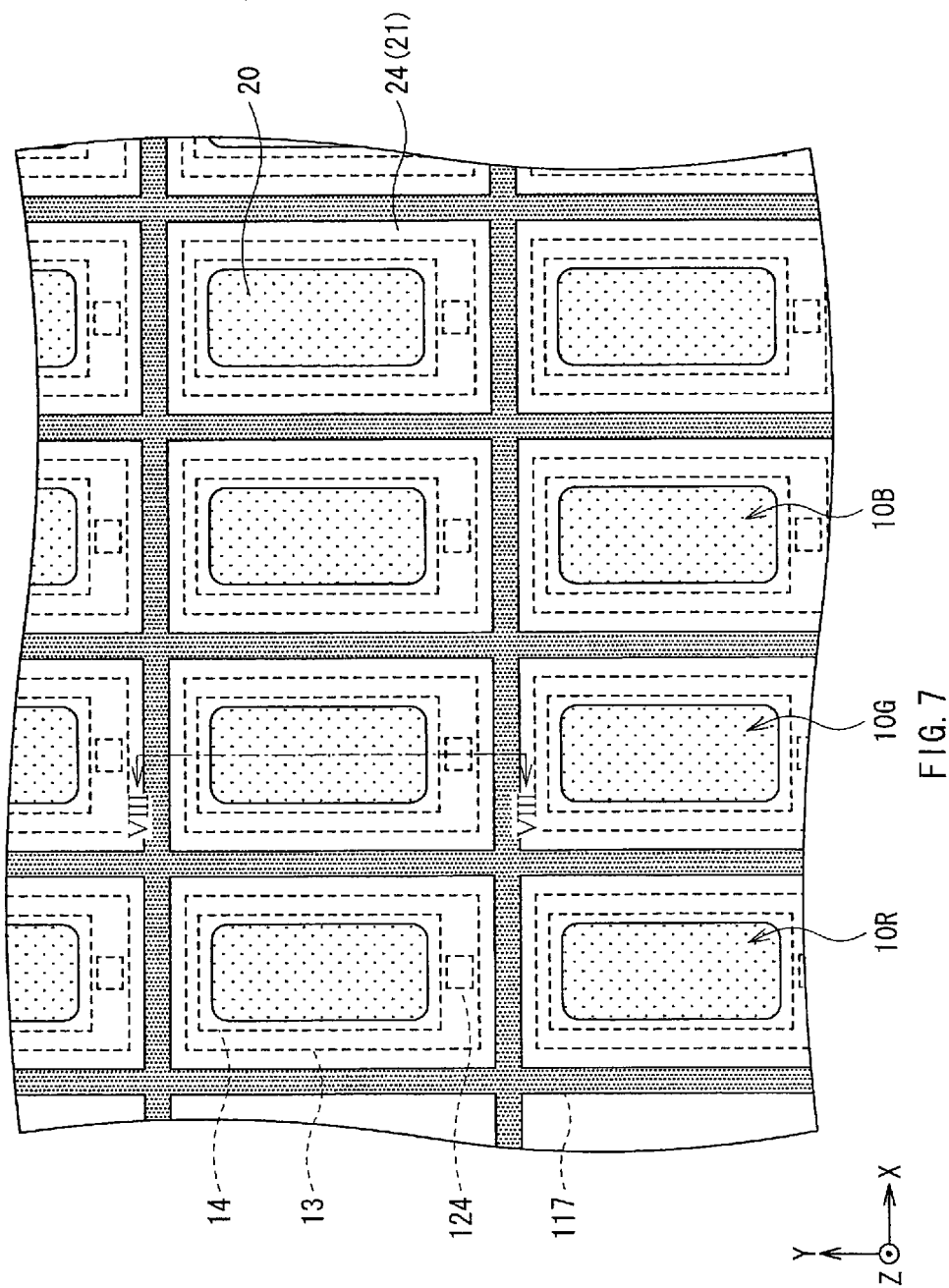
FIG. 7 is a top view showing a configuration of a display unit according to a comparative example.
Figure 8:
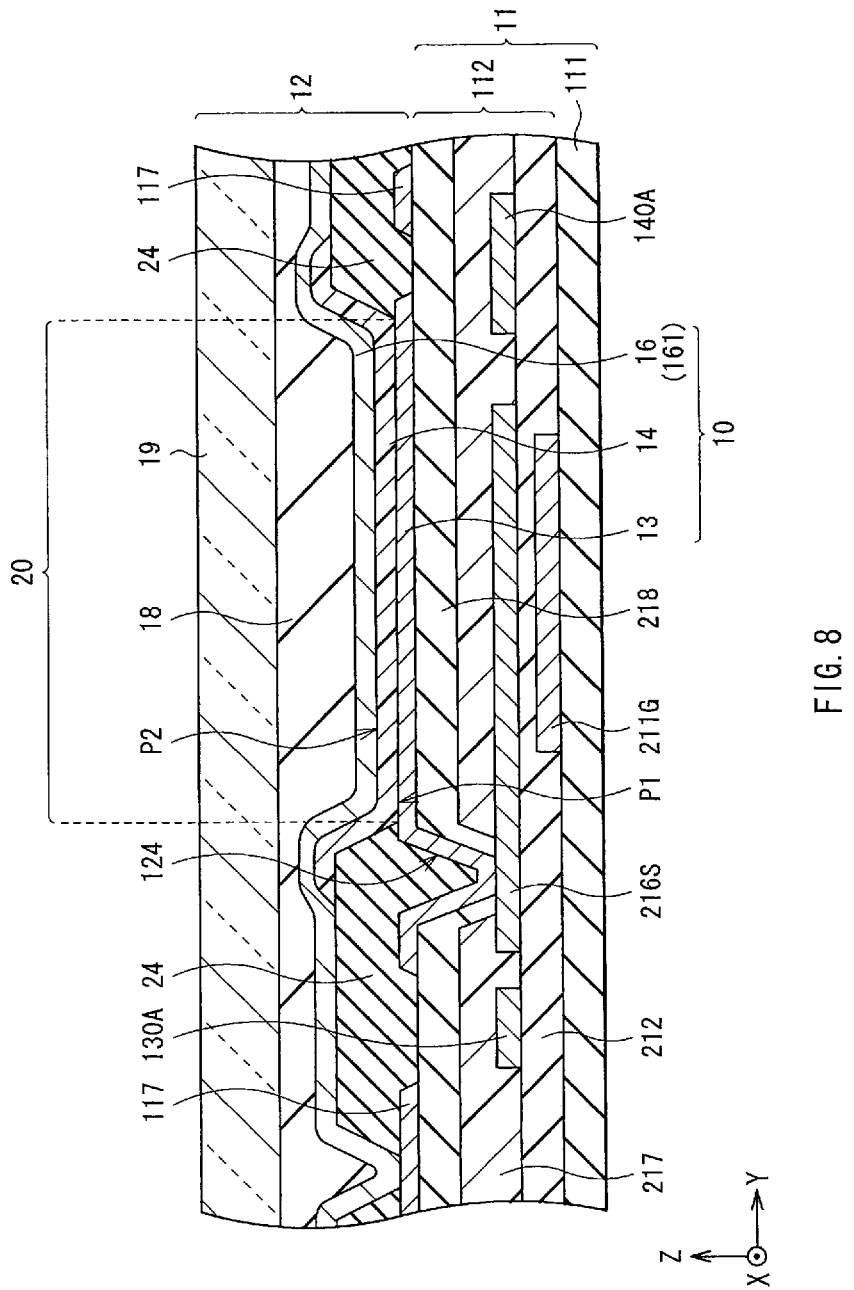
FIG. 8 is a cross-sectional diagram showing a configuration of a display region illustrated in FIG. 7.

In addition, because the necessity for preparing a space for providing the auxiliary wiring at the display region 110 is eliminated, it is to possible to fully assure a luminescent region (occupied area of the light-emitting sections 20) of each of the organic light-emitting elements 10 without causing reduction in the aperture ratio. On the contrary, as shown in examples in FIG. 7 and FIG. 8, when auxiliary wiring 117 is also provided at a gap area (gap section 21) between the organic light-emitting elements 10 to prevent any voltage drop in the second electrode layer 16, the aperture ratio will be reduced. This is because a space for arranging the auxiliary wiring 117 is necessary. Accordingly, in this embodiment of the present disclosure, it is possible to improve the luminance of an overall display screen as compared with a case where the auxiliary wiring is provided at a gap area between the organic light-emitting elements. This allows to fully deal with further growth in display screen size. It is to be noted that FIG. 7 shows a planar configuration of a display unit as a comparative example for the display unit according to this embodiment of the present disclosure, corresponding to FIG. 3. Further, FIG. 8 is a cross-sectional diagram taken along VIII-VIII line in the display unit as the comparative example that is illustrated in FIG. 7, corresponding to FIG. 4. In FIG. 7, the auxiliary wiring 117 is shown with the increasing emphasis to enhance the visibility.

Modification Examples

Figure 9:
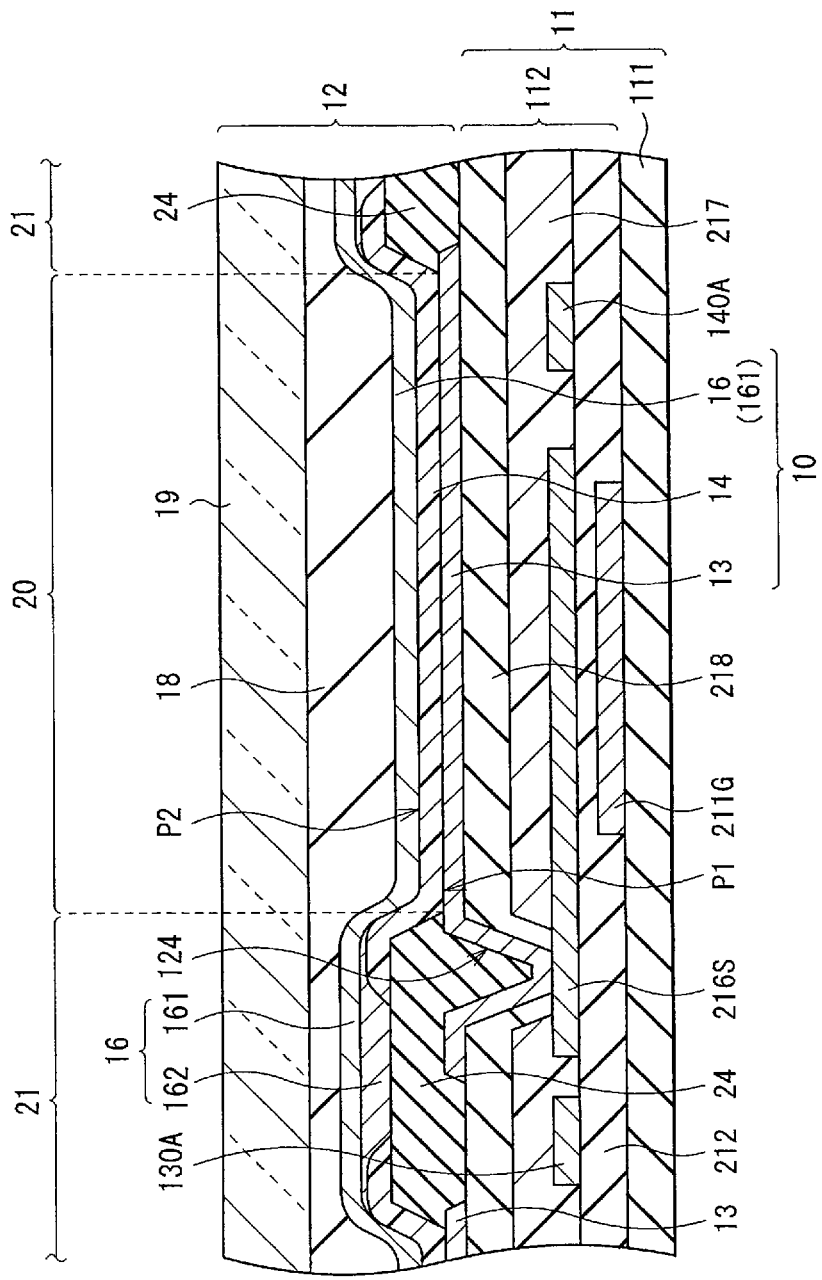
FIG. 9 is a cross-sectional diagram showing a substantial part configuration of a display unit according to a first modification example.

The present technology is described thus far with reference to the example embodiment, although the present technology is not limited to the above-described embodiment, but different variations are available. For example, in the above-described embodiment of the present disclosure, the second electrode layer 16 is formed by laminating the first conductive layer 161 and the second conductive layer 162 in this order on the aperture-defining insulating film 24 at the gap section 21, although the present technology is not limited thereto. For example, as shown in FIG. 9, a method may be adopted in which the second conductive layer 162 is first formed on the aperture-defining insulating film 24, and then the first conductive layer 161 is formed in a manner to cover the whole surface (first modification example).

Figure 10:
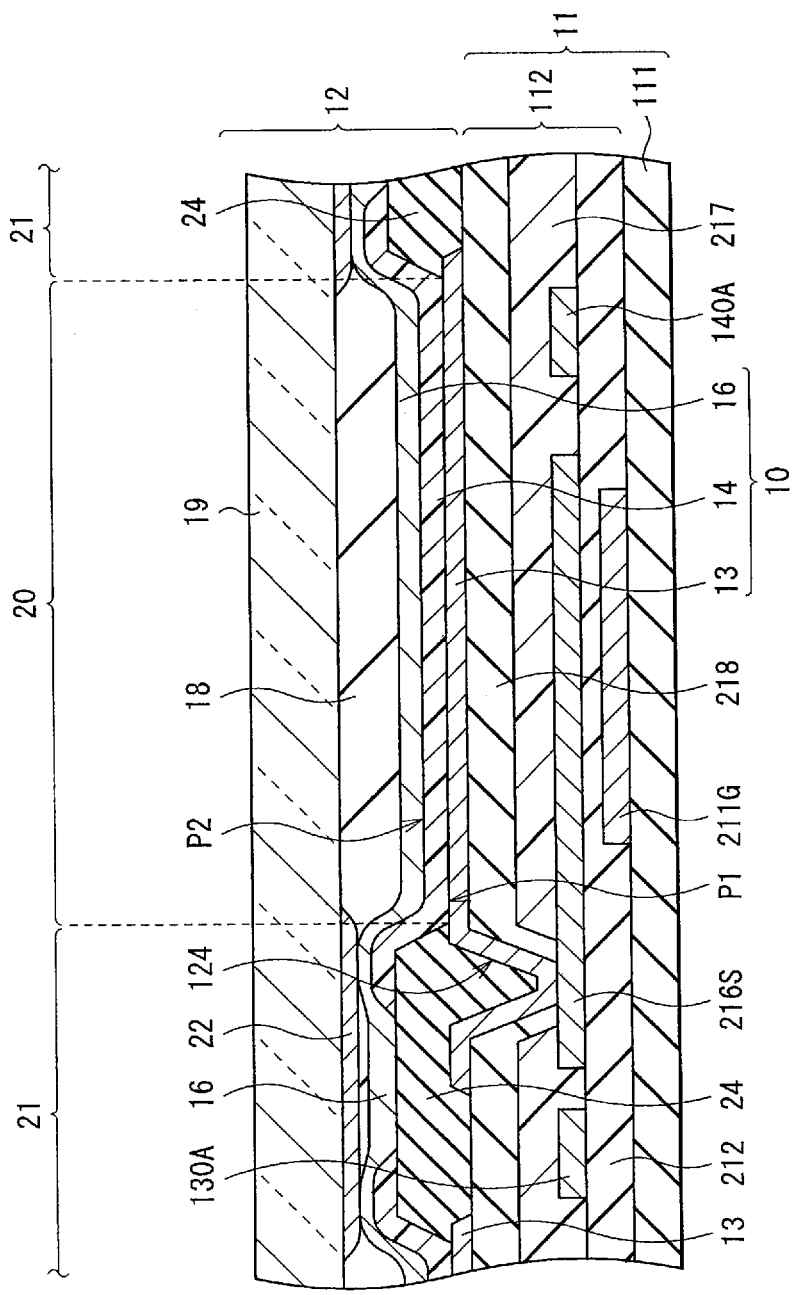
FIG. 10 is a cross-sectional diagram showing a substantial part configuration of a display unit according to a second modification example.

Additionally, as shown in FIG. 10, a method may be adopted in which a conductive film pattern 22 is provided at a region opposite to the gap section 21 on the top surface of the sealing substrate 19, and this is brought into contact with the second electrode layer 16 (second modification example). This structure may be achieved, for example, in such a manner that the conductive film pattern 22 in a predetermined shape is formed beforehand at a predetermined position on the sealing substrate 19, and this pattern is attached to the substrate 111 on which the organic light-emitting elements 10 are formed. This makes it possible to simplify a structure and manufacturing processes, while achieving reduction in screen thickness of the display unit.

Figure 11:
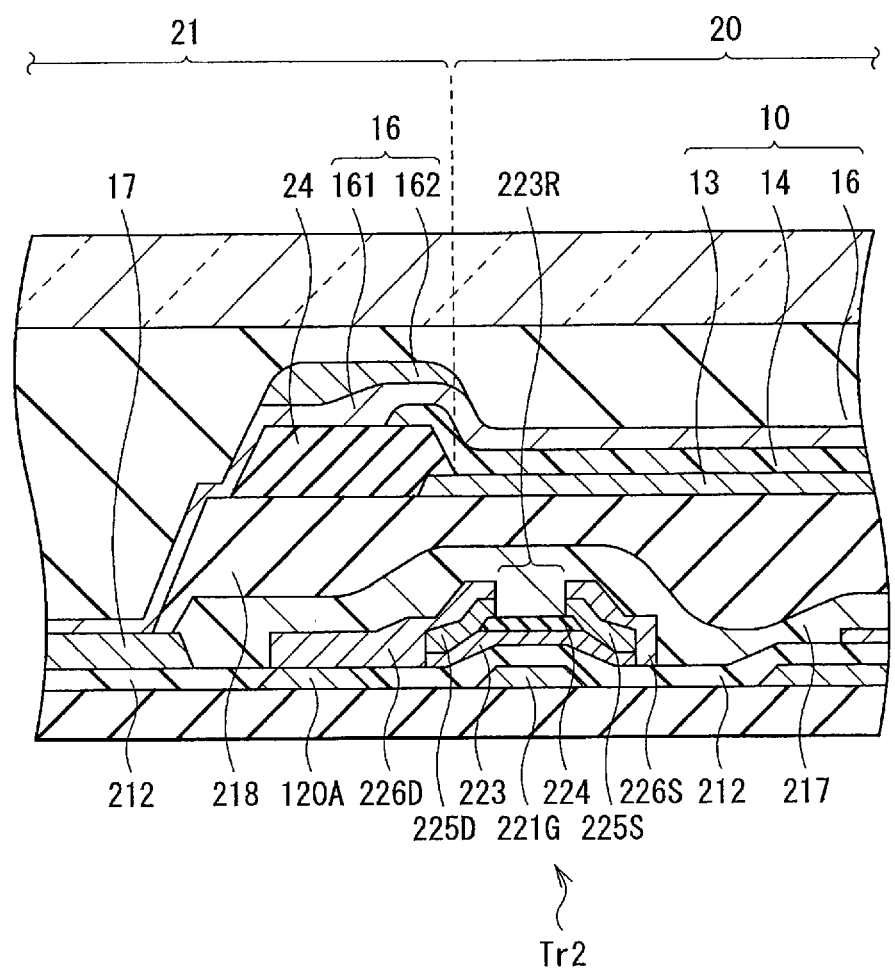
FIG. 11 is a cross-sectional diagram showing a substantial part configuration of a display unit according to a third modification example.

Further, in the above-described embodiment of the present disclosure, the looped auxiliary wiring 17 surrounding the display region 110 is provided on the planarizing film 218 as well as on the first electrode layer 13, although the present technology is not limited thereto. For example, like a third modification example illustrated in FIG. 11, the auxiliary wiring 17 may be provided as a second-level metallic layer on the gate insulating film 212. In this case, the auxiliary wiring 17 may be formed using the same kind of material in conjunction with the scanning lines 130A, power supply lines 140A, and the like in addition to the metallic layers 216D, 226D, 216S, and 226S as the second-level metallic layers. Further, an opening may be formed by selectively digging down the aperture-defining insulating film 24 and the planarizing film 218 to expose the top surface of the auxiliary wiring 17. Thereafter, the second electrode layer 16 (first conductive layer 161) may be formed to cover the opening and the top surface of the auxiliary wiring 17. It is to be noted that when the auxiliary wiring 17 is formed on the planarizing film 218, it is possible to arrange the auxiliary wiring 17 at a region overlapping with peripheral circuits, such as the signal-line driving circuit 120, the scanning-line driving circuit 130, and the power supply line driving circuit 140. On the other hand, as shown in FIG. 11, when the auxiliary wiring 17 is formed in a layer same in layer as the driving transistor Tr1 and the like, the auxiliary wiring 17 may be disposed at one or both of a gap area between the display region 110 and the above-described peripheral circuits and a region outside the above-described peripheral circuits.

Figure 12:
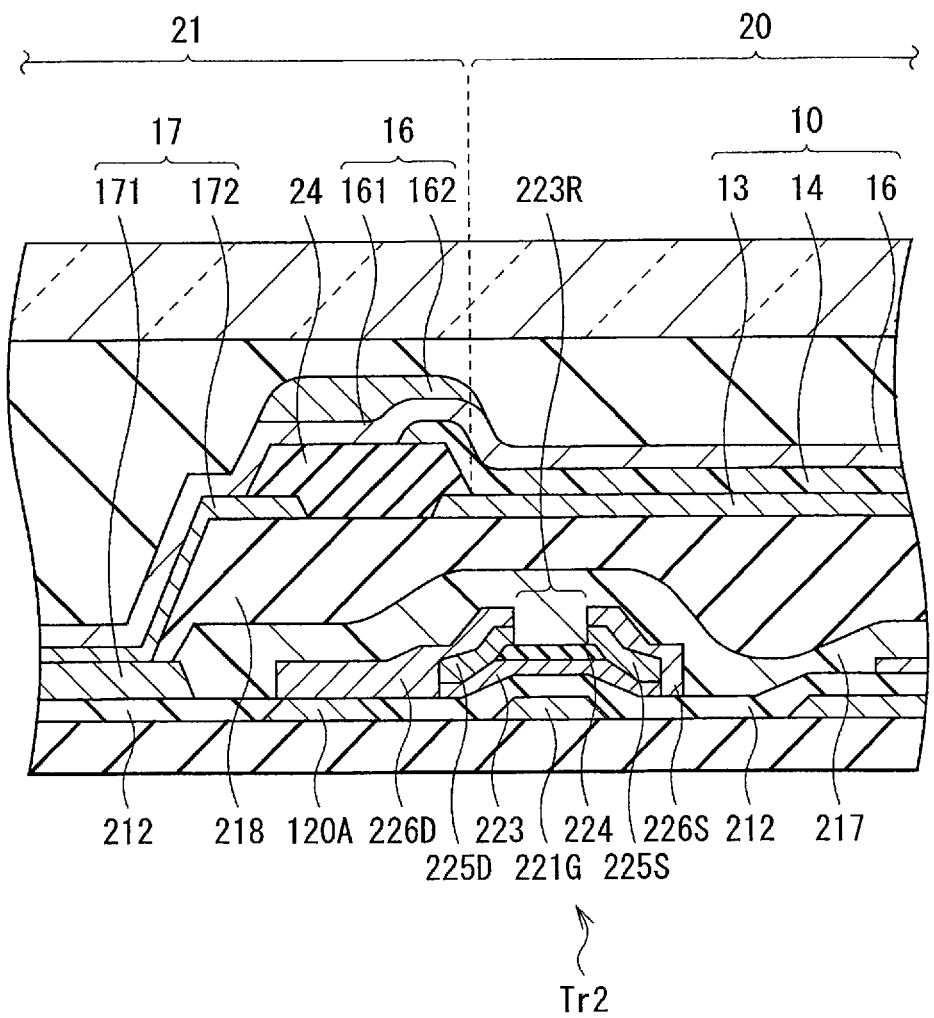
FIG. 12 is a cross-sectional diagram showing a substantial part configuration of a display unit according to a fourth modification example.

Alternatively, for example, like a fourth modification example illustrated in FIG. 12, the auxiliary wiring 17 may be provided that is composed of a two-layer structure having a metallic layer 171 which is provided on the gate insulating film 212 and a metallic layer 172 covering the planarizing film 218.

Figure 13:
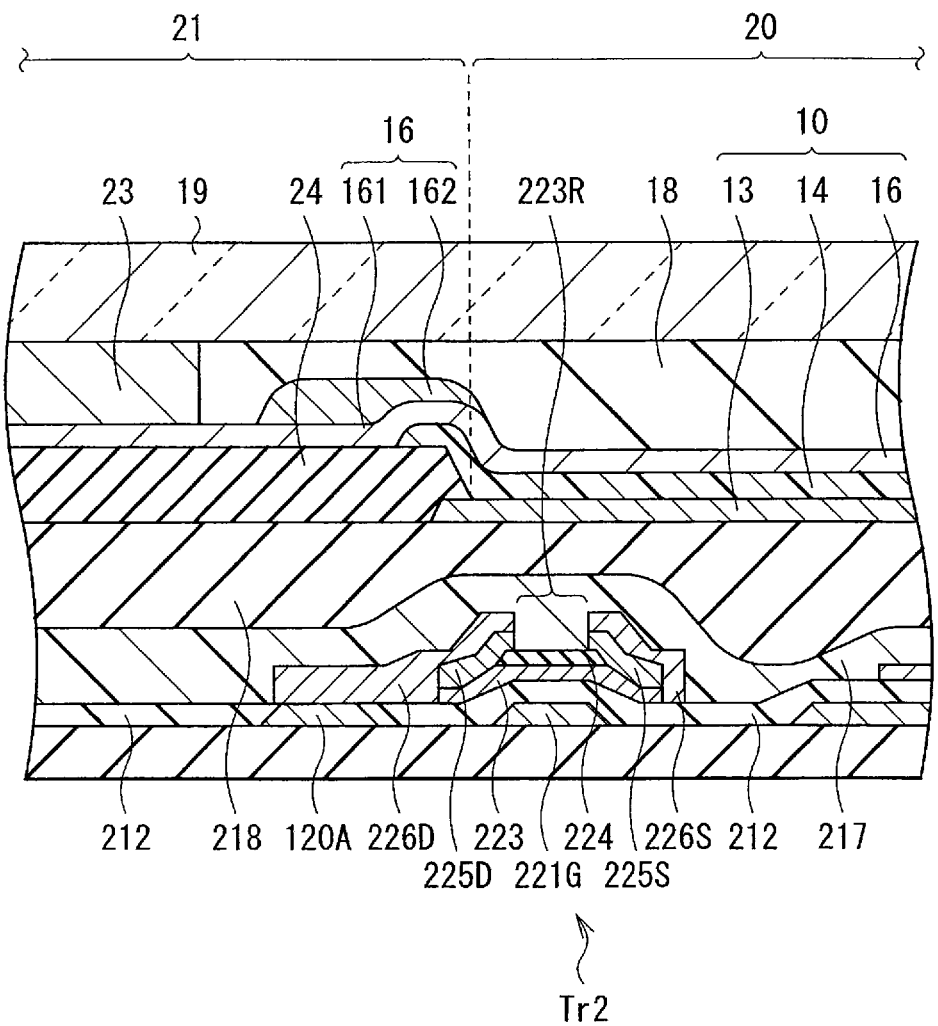
FIG. 13 is a cross-sectional diagram showing a substantial part configuration of a display unit according to a fifth modification example.

Further, in one embodiment of the present technology, for example, like a fifth modification example illustrated in FIG. 13, as an alternative to the auxiliary wiring 17, a looped seal section 23 surrounding the display region 110 may be formed using a conductive adhesive material. The seal section 23 is capable of preventing outflow of the protective film 18 and performing the functionality as the auxiliary wiring 17 for the second electrode layer 16 with bottom face thereof bonded to the second electrode layer 16 and with top face thereof bonded to the sealing substrate 19.

Additionally, in the above-described embodiment of the present disclosure, the first conductive layer 161 is formed in common over both areas of the light-emitting section 20 and the gap section 21, although the present technology is not limited thereto. For example, the second electrode layer 16 may be formed separately for each of the light-emitting section 20 and the gap section 21. However, when the second electrode layer 16 at the gap section 21 is composed of a laminated structure including the first and second conductive layers, one or both of the first and second conductive layers may be made of the same kind of material as the second electrode layer 16 on the light-emitting section 20.

Moreover, in the above-described embodiment of the present disclosure, a case where the organic light-emitting elements 10R, 10G, and 10R are provided by assigning different colors for the organic layers 14 that emit red-color light, green-color light, and blue-color light, respectively, is illustrated by an example, although the present technology is not limited thereto. For example, all the organic light-emitting elements 10 may be set up to emit white-color light, and each color light may be taken out by means of a color filter that is provided separately. In this case, the organic layers 14 are provided in common with some or all the plurality of the organic light-emitting elements 10, and include a portion covering the aperture-defining insulating film 24 as well.

Also, in the above-described embodiment of the present disclosure, a case where one pixel is composed of the organic light-emitting elements 10R, 10G, and 10R emitting red-color light, green-color light, and blue-color light, respectively, is illustrated by an example, although the present technology is not limited thereto. For example, one pixel may be composed of four kinds of organic light-emitting elements including an organic light-emitting element 10W that emits white-color light or an organic light-emitting element 10Y that emits yellow-color light in addition to the above-described three kinds of the organic light-emitting elements 10R, 10G, and 10R.

Further, the display unit may be permitted that extracts red-color light, green-color light, blue-color light, and yellow-color light by using organic light-emitting elements 10Y and 10B emitting yellow-color light and blue-color light respectively in conjunction with color filters of red-color light, green-color light, blue-color light, and yellow-color light. Alternatively, the display unit may be also permitted that extracts red-color light, green-color light, and blue-color light by using the organic light-emitting elements 10Y and 10B emitting yellow-color light and blue-color light respectively in conjunction with color filters of red-color light, green-color light, and blue-color light.

Additionally, the present technology is not limited to materials and lamination sequences for each layer, or film formation methods that are described in the present embodiment. For example, in the above-described embodiment of the present disclosure, a case where the first electrode layer 13 is served as an anode, and the second electrode layer 16 is served as a cathode is described, although the first electrode layer 13 may be served as a cathode, and the second electrode layer 16 may be served as an anode. Moreover, in the above-described embodiment of the present disclosure, a configuration of the light-emitting section 20 is explained with concrete descriptions, although any other layers may be further provided. For example, a hole injection thin-film layer that is composed of a material, such as chromium oxide (III)($Cr_2O_3$) and ITO (Indium-Tin Oxide: oxide-mixed film of indium (In) and tin (Sn)) may be provided between the first electrode layer 13 and the organic layer 14.

Moreover, in the above-described embodiment of the present disclosure, a case of the active-matrix type display unit is described, although the present technology is also applicable to a passive-matrix type display unit. Further, a configuration of the pixel driving circuit for active-matrix drive is not limited to any configuration that is described in the above-described embodiment of the present disclosure, but capacitor elements or transistors may be added as appropriate. In this case, any necessary driving circuit may be added apart from the signal-line driving circuit 120 and the scanning-line driving circuit 130 as described above in accordance with a change to the pixel driving circuit.

Application Examples

Hereinafter, the description is provided on application examples of the display units that are described in the above-mentioned embodiment and the modification examples thereof of the present disclosure. The display units according to the above-mentioned embodiment and the modification examples of the present disclosure are applicable to electronic apparatuses in every field, such as a television receiver, a digital camera, a notebook personal computer, a mobile terminal including a cellular phone, and a video camera. In other words, the display units according to the above-mentioned embodiment and the modification examples of the present disclosure are applicable to electronic apparatuses in every field that display externally-input image signals or internally-generated image signals as images or video pictures.

(Module)

Figure 14:
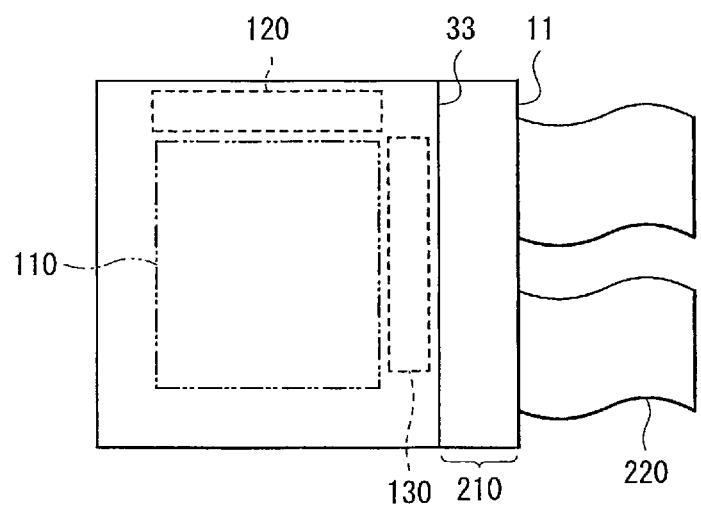
FIG. 14 is a top view showing a simplified structure of a module including the display unit according to any of the above-described embodiment and the modification examples of the present disclosure.

The display units according to the above-mentioned embodiment and the modification examples of the present disclosure may be built into various electronic apparatuses in first to sixth application examples 1 to 6 to be hereinafter described as a module shown in FIG. 14 for example. For example, this module may have a region 210 exposed from a sealing substrate 19 and the like at one side of the substrate 111, extending wiring of the signal-line driving circuit 120 and the scanning-line driving circuit 130 to form external connection terminals (not shown in the figure) at this exposed region 210. An FPC (Flexible Printed Circuit) 220 for signal input/output may be provided for the external connection terminals.

Application Example 1

Figure 15:
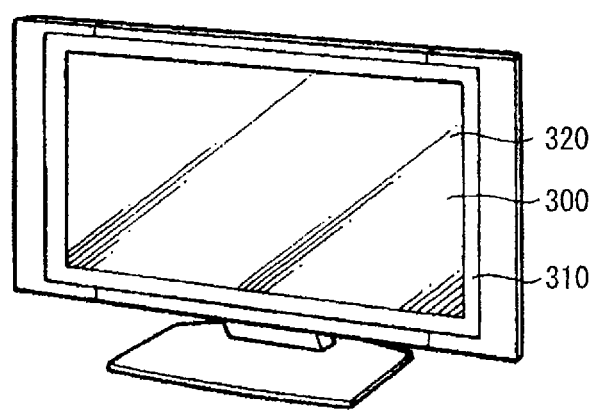
FIG. 15 is a perspective view showing an external appearance of a television receiver as a first application example for the display unit according to any of the above-described embodiment and the modification examples of the present disclosure.

FIG. 15 shows an external view of a television receiver to which any of the display units according to the above-mentioned embodiment and the modification examples of the present disclosure is applicable. This television receiver may have, for example, an image display screen section 300 including a front panel 310 and a filter glass 320, and the image display screen section 300 is composed of any of the display units according to the above-mentioned embodiment and the modification examples of the present disclosure.

Application Example 2

Figure 16A:
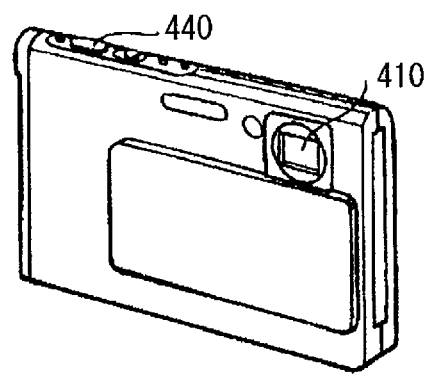
FIG. 16A is a first perspective view showing an external appearance of a digital camera as a second application example for the display unit according to any of the above-described embodiment and the modification examples of the present disclosure.
Figure 16B:
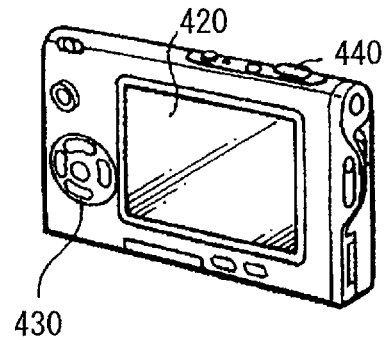
FIG. 16B is a second perspective view showing an external appearance of the digital camera as the second application example for the display unit according to any of the above-described embodiment and the modification examples of the present disclosure.

FIGS. 16A and 16B each show an external view of a digital camera to which any of the display units according to the above-mentioned embodiment and the modification examples of the present disclosure is applicable. This digital camera may have, for example, a light emitting section 410 for flashing, a display section 420, a menu switch 430, and a shutter button 440, and the display section 420 is composed of any of the display units according to the above-mentioned embodiment and the modification examples of the present disclosure.

Application Example 3

Figure 17:
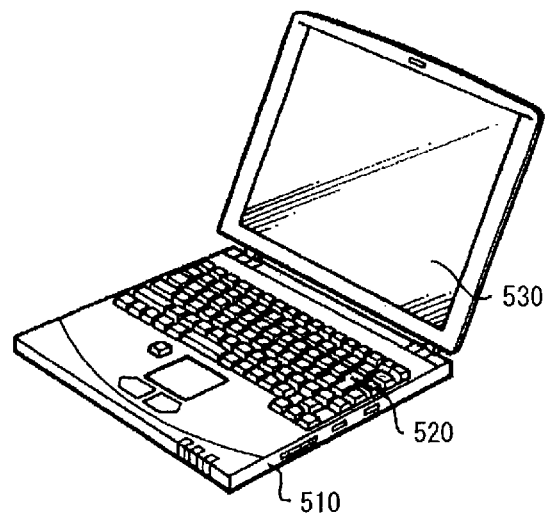
FIG. 17 is a perspective view showing an external appearance of a notebook personal computer as a third application example for the display unit according to any of the above-described embodiment and the modification examples of the present disclosure.

FIG. 17 shows an external view of a notebook personal computer to which any of the display units according to the above-mentioned embodiment and the modification examples of the present disclosure is applicable. This notebook personal computer may have, for example, a main body 510, a keyboard 520 for operation of entering characters and the like, and a display section 530 for image display, and the display section 530 is composed of any of the display units according to the above-mentioned embodiment and the modification examples of the present disclosure.

Application Example 4

Figure 18:
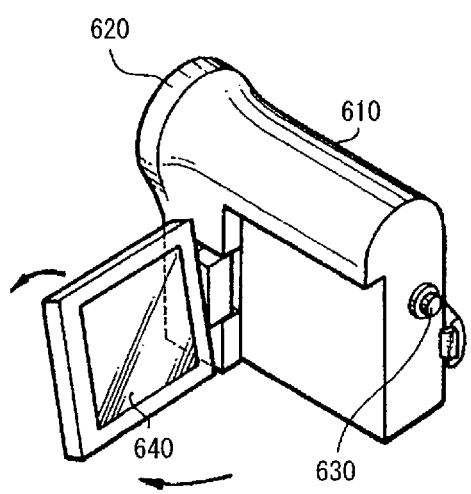
FIG. 18 is a perspective view showing an external appearance of a video camera as a fourth application example for the display unit according to any of the above-described embodiment and the modification examples of the present disclosure.

FIG. 18 shows an external view of a video camera to which any of the display units according to the above-mentioned embodiment and the modification examples of the present disclosure is applicable. This video camera may have, for example, a main body section 610, a lens 620 for shooting an image of a subject that is provided at the front lateral side of the main body section 610, a start/stop switch 630 for starting or stopping the shooting of the image of the subject, and a display section 640, and the display section 640 is composed of any of the display units according to the above-mentioned embodiment and the modification examples of the present disclosure.

Application Example 5

Figure 19A:
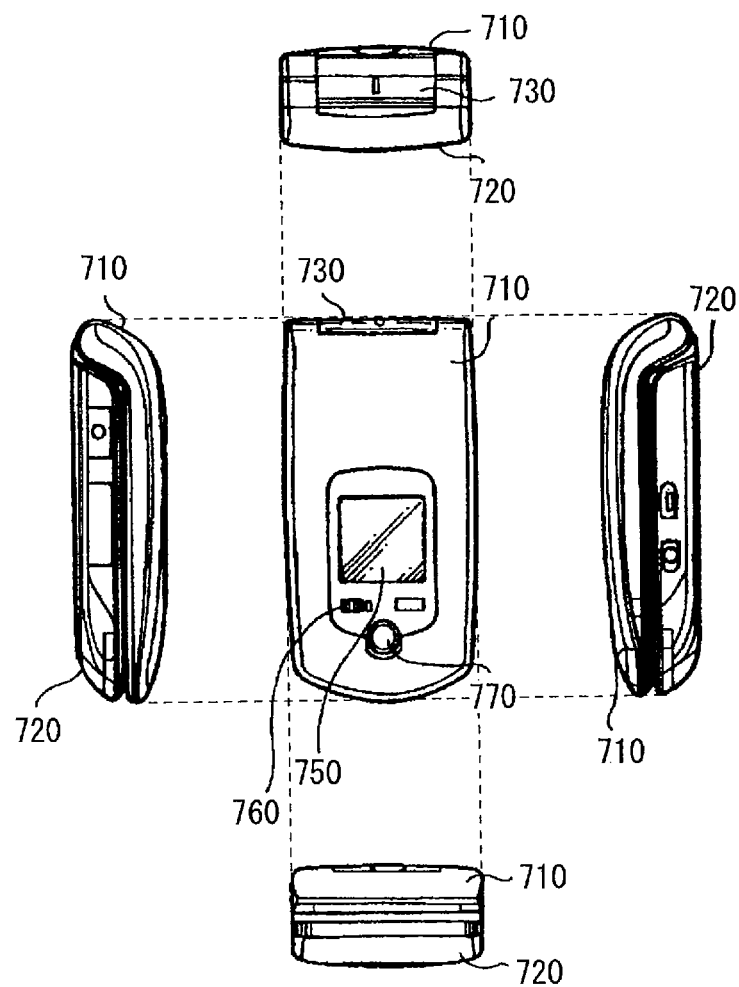
FIG. 19A is a front view, a left-side view, a right-side view, a top view, and a bottom view showing an external appearance in a closed state of a cellular phone as a fifth application example for the display unit according to any of the above-described embodiment and the modification examples of the present disclosure.
Figure 19B:
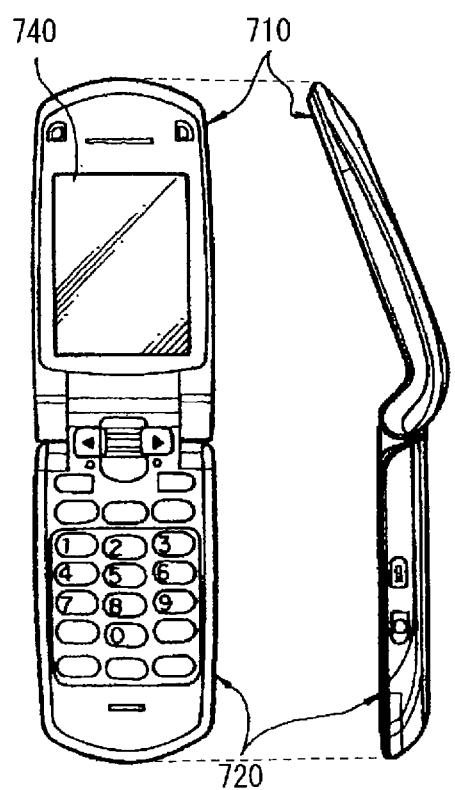
FIG. 19B is a front view and a side view showing an external appearance in an open state of the cellular phone as the fifth application example for the display unit according to any of the above-described embodiment and the modification examples of the present disclosure.

FIGS. 19A and 19B each show an external view of a cellular phone to which any of the display units according to the above-mentioned embodiment and the modification examples of the present disclosure is applicable. For example, this cellular phone, which may join an upper chassis 710 and a lower chassis 720 with a coupling section (hinge section) 730, may have a display 740, a sub-display 750, a picture light 760, and a camera 770. The display 740 or the sub-display 750 is composed of any of the display units according to the above-mentioned embodiment and the modification examples of the present disclosure.

Application Example 6

Figure 20A:
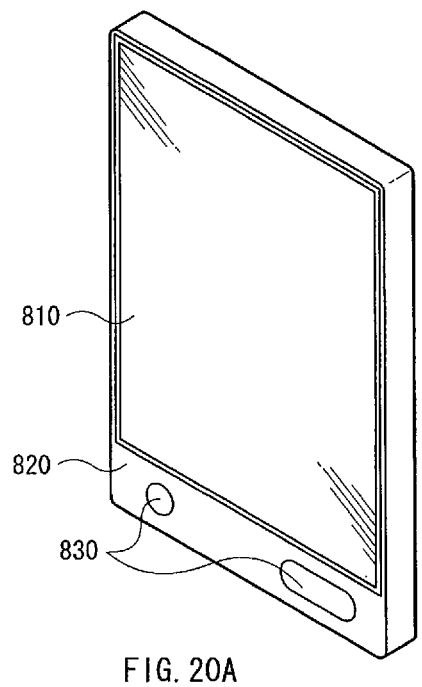
FIG. 20A is a first perspective view showing an external appearance of a tablet-type PC as a sixth application example using the display unit according to any of the above-described embodiment and the modification examples of the present disclosure.
Figure 20B:
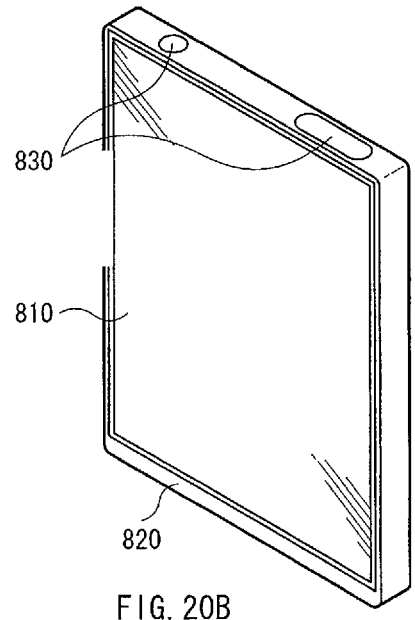
FIG. 20B is a second perspective view showing an external appearance of the tablet-type PC as the sixth application example using the display unit according to any of the above-described embodiment and the modification examples of the present disclosure.

FIGS. 20A and 20B each show an external configuration of a so-called tablet-type personal computer (PC). This tablet-type PC may include, for example, a display section 810, a non-display section 820 including a housing for holding the display section 810, and an operational section 830 including a power switch. It is to be noted that the operational section 830 may be provided at the front side of the non-display section 820 as shown in FIG. 20A, or may be provided on the top side as shown in FIG. 20B. The display section 810 is a touch screen (touch panel) with a position input function (pointing function) in addition to an image display function.

Furthermore, the technology encompasses any possible combination of some or all of the various embodiments described herein and incorporated herein.

It is possible to achieve at least the following configurations from the above-described example embodiments of the disclosure.

(1) A display unit comprising:
an organic layer between a light-emitting section portion of a first electrode layer and a light-emitting section portion of a second electrode layer, light being emissible from within said organic layer;
an aperture-defining insulating film between a contact section of the first electrode layer and a gap section portion of the second electrode layer, wherein the thickness of said gap section portion of the second electrode layer is greater than the thickness of said light-emitting section portion of the second electrode layer.

(2) A display unit according to (1), further comprising:
wiring electrically connected to said contact section of the first electrode layer, said contact section of the first electrode layer being between said aperture-defining insulating film and said wiring.

(3) A display unit according to (1) or (2), further comprising:
a driving transistor electrically connected to said contact section of the first electrode layer.

(4) A display unit according to any one of (1) or (3), wherein said organic layer comprises:
a hole transportation layer between a hole injection layer and a luminescent layer, said luminescent layer being between an electron transportation layer and said hole transportation layer.

(5) A display unit according to any one of (1) or (4), wherein said gap section portion of the second electrode layer comprises:
a first conductive layer and a second conductive layer, said second conductive layer being in physical contact with said first conductive layer.

(6) A display unit according to any one of (1) or (5), wherein a volume resistivity of the second conductive layer is lower than a volume resistivity of the first conductive layer.

(7) A display unit according to any one of (1) or (6), wherein said first conductive layer is an indium tin oxide layer.

(8) A display unit according to any one of (1) or (7), wherein said first conductive layer includes indium, zinc, and oxygen.

(9) A display unit according to any one of (1) or (8), wherein said second conductive layer is a conductive metallic material.

(10) A display unit according to any one of (1) or (9), wherein said first conductive layer is electrically connected to said light-emitting section portion of the second electrode layer.

(11) A display unit according to any one of (1) or (10), wherein said first conductive layer and said light-emitting section portion of the second electrode layer are a same material.

(12) A display unit according to any one of (1) or (11), wherein said first conductive layer and said second conductive layer are said same material.

(13) A display unit according to any one of (1) or (12), wherein said first conductive layer and said second conductive layer are of different materials.

(14) A display unit according to any one of (1) or (13), wherein said light is transmissible through said first conductive layer, said second conductive layer being opaque to said light.

(15) A display unit according to any one of (1) or (14), wherein an opening extends through a planarizing film, said contact section of the first electrode layer being within said opening.

(16) A display unit according to any one of (1) or (15), wherein said light-emitting section portion of the first electrode layer is between said organic layer and said planarizing film.

(17) A display unit, including:
a plurality of light-emitting elements each of which is arranged on a base substrate and includes a light-emitting section, each of the light-emitting sections including a first electrode layer, an organic layer having a luminescent layer, and a second electrode layer that are laminated in this order on the base substrate; and
an insulating layer separating the light-emitting sections of the light-emitting elements from one another,
wherein the second electrode layer is provided in common among a part or all of the light-emitting elements, and includes a gap portion that covers the insulating layer, and
wherein the second electrode layer has a resistance in an in-plane direction smaller in the gap portion than in a luminescent portion, the luminescent portion composing the light-emitting section.

(18) The display unit according to (17), wherein the second electrode layer includes a portion in the gap portion greater in thickness than the luminescent portion.

(19) The display unit according to (18), wherein the second electrode layer is made of a same kind of material for both of the luminescent portion and the gap portion.

(20) The display unit according to (18), wherein the gap portion of the second electrode layer has a laminated structure including a first layer and a second layer, one or both of the first layer and the second layer being made of a same kind of material as the luminescent portion.

(21) The display unit according to (20), wherein the second layer is made of a material having a volume resistivity smaller than a volume resistivity of the luminescent portion.

(22) The display unit according to any one of (17) to (21), wherein the organic layer is provided in common among a part or all of the light-emitting elements, and includes a portion that also covers the insulating layer.

(23) The display unit according to any one of (17) to (22), wherein
the base substrate includes a driving element that controls a voltage to be applied across the first electrode layer and the second electrode layer, and
the first electrode layer is conductive with the driving element at a region in which the insulating layer is provided.

(24) The display unit according to any one of (17) to (23), further including an auxiliary wiring that is conductive with the second electrode layer and surrounding a display section in which the light-emitting elements are arranged.

(25) The display unit according to (24), wherein the auxiliary wiring is provided in a layer same in level as the first electrode layer.

(26) The display unit according to any one of (17) to (25), wherein
the light-emitting elements are arrayed in a first direction and a second direction that intersect with one another, and
the gap portion of the second electrode layer extends in the first direction and the second direction.

(27) An electronic apparatus provided with a display unit, the display unit including:
a plurality of light-emitting elements each of which is arranged on a base substrate and includes a light-emitting section, each of the light-emitting sections including a first electrode layer, an organic layer having a luminescent layer, and a second electrode layer that are laminated in this order on the base substrate; and
an insulating layer separating the light-emitting sections of the light-emitting elements from one another,
wherein the second electrode layer is provided in common among a part or all of the light-emitting elements, and includes a gap portion that covers the insulating layer, and
wherein the second electrode layer has a resistance in an in-plane direction smaller in the gap portion than in a luminescent portion, the luminescent portion composing the light-emitting section.

The present disclosure contains subject matter related to that disclosed in Japanese Priority Patent Application JP 2012-170488 filed in the Japan Patent Office on Jul. 31, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display unit comprising:
    an aperture-defining insulating film between a first conductive layer and a first electrode, the first electrode and the first conductive layer touching the aperture-defining insulating film;
    a second conductive layer between the first conductive layer and a protective film, the protective film and the first conductive layer touching the second conductive layer,
    wherein the first conductive layer is between the aperture-defining insulating film and the second conductive layer, and a volume resistivity of the second conductive layer is lower than a volume resistivity of the first conductive layer.

2. A display unit according to claim 1, further comprising:
    an organic layer between the first electrode and the first conductive layer, the first conductive layer extending from the organic layer to the aperture-defining insulating film.

3. A display unit according to claim 2, wherein the organic layer touches the aperture-defining insulating film.

4. A display unit according to claim 2, wherein the first electrode and the first conductive layer touch the organic layer.

5. A display unit according to claim 2, wherein light is emissible from within the organic layer.

6. A display unit according to claim 2, wherein the organic layer comprises:
    a hole transportation layer between a hole injection layer and a luminescent layer, the luminescent layer being between an electron transportation layer and the hole transportation layer.

7. An electronic apparatus comprising:
    the display unit according to claim 2;
    a housing, the display unit being in the housing.

8. A display unit according to claim 1, further comprising:
    wiring electrically connected to a contact section of the first electrode, the contact section of the first electrode being between the aperture-defining insulating film and the wiring.

9. A display unit according to claim 7, further comprising:
    a gate insulating film between a metallic layer and a channel layer, the channel layer touching the wiring.

10. A display unit according to claim 9, wherein the gate insulating film touches the metallic layer and the channel layer.

11. A display unit according to claim 9, wherein the channel layer is a semiconductor thin film.

12. A display unit according to claim 9, wherein the channel layer is silicon.

13. A display unit according to claim 9, wherein the channel layer is amorphous silicon.

14. A display unit according to claim 9, further comprising:
    an insulating channel protective film between a source electrode and a drain electrode, the channel layer being between the gate insulating film and the insulating channel protective film.

15. A display unit according to claim 14, wherein the wiring touches the source electrode and the channel layer, and the channel layer touches the source electrode and the drain electrode.

16. A display unit according to claim 14, wherein the source electrode and the drain electrode are silicon.

17. A display unit according to claim 14, wherein the source electrode and the drain electrode are amorphous silicon.

18. A display unit according to claim 14, wherein the source electrode and the drain electrode are n-type amorphous silicon.

19. A display unit according to claim 1, wherein the first electrode is a material that is optically reflective and electrically conductive.

20. A display unit according to claim 1, wherein the first conductive layer is an electrically conductive metallic material, and the second conductive layer is another electrically conductive metallic material.

21. A display unit according to claim 1, wherein the first electrode contains aluminum.

22. A display unit according to claim 1, wherein the first conductive layer contains indium and oxygen.

23. A display unit according to claim 1, wherein the second conductive layer contains a material from the group consisting of aluminum, copper and gold.

24. A display unit according to claim 1, wherein light is transmissible through the first conductive layer, and the second conductive layer is opaque to light.

25. A display unit according to claim 1, wherein the protective film touches the first conductive layer.

* * * * *